(12) United States Patent
Yang

(10) Patent No.: US 6,566,153 B1
(45) Date of Patent: May 20, 2003

(54) PROCESS FOR FABRICATING ORGANIC SEMICONDUCTOR DEVICES USING INK-JET PRINTING TECHNOLOGY AND DEVICE AND SYSTEM EMPLOYING SAME

(75) Inventor: Yang Yang, Los Angeles, CA (US)

(73) Assignee: The Regents of the University of California, Oakland, CA (US)

( * ) Notice: Subject to any disclaimer, the term of this patent is extended or adjusted under 35 U.S.C. 154(b) by 0 days.

(21) Appl. No.: 09/601,068
(22) PCT Filed: Oct. 14, 1998
(86) PCT No.: PCT/US98/21665
§ 371 (c)(1),
(2), (4) Date: Mar. 19, 2001
(87) PCT Pub. No.: WO99/21233
PCT Pub. Date: Apr. 29, 1999

(51) Int. Cl.[7] ............................................. H01L 21/00
(52) U.S. Cl. .................................................. 438/29
(58) Field of Search .............................. 438/14, 21, 57, 438/29; 257/40

(56) References Cited

U.S. PATENT DOCUMENTS

| | | | |
|---|---|---|---|
| 5,462,822 A | * 10/1995 | Roosen et al. | 430/7 |
| 5,645,962 A | * 7/1997 | Vanmaele et al. | 430/7 |
| 5,895,692 A | 4/1999 | Shirasaki et al. | 427/68 |
| 6,066,357 A | * 5/2000 | Tang et al. | 427/66 |
| 6,087,196 A | * 7/2000 | Sturm et al. | 438/29 |
| 6,194,119 B1 | * 2/2001 | Wolk et al. | 430/200 |
| 6,291,126 B2 | * 9/2001 | Wolk et al. | 430/200 |
| 6,384,727 B1 | * 5/2002 | Diprizio et al. | 340/572.7 |

FOREIGN PATENT DOCUMENTS

| JP | 7-235378 | 6/1996 |
|---|---|---|
| JP | 3036436 | 2/2000 |

* cited by examiner

*Primary Examiner*—David Nelms
*Assistant Examiner*—Thao Phuong Le
(74) *Attorney, Agent, or Firm*—Foley & Lardner

(57) ABSTRACT

An emission system for presenting visual image is disclosed. The emissive system typically contains first electrodes deposited over and in contact with a substrate. One or more conjugated organic buffer layers are then deposited over and in contact with the first electrodes, and second electrodes are subsequently deposited over the conjugated organic buffer layers. The conjugated organic buffer layers regulate current flow between the first electrodes and the second electrodes. Either before or after the deposition of each conjugated organic buffer layer, but before the deposition of the second electrodes, conjugated organic deposits are ink-jet printed such that they are in contact with at least one conjugated organic buffer layer. The conjugated organic deposits help to generate an indicator when a voltage stimulus is applied across the first electrodes and the second electrodes. Depending on the material of the conjugated organic deposits, the indicator may be luminescence, fluorescence, conductivity, or the like. A voltage source is used for selectively applying the voltage stimulus across the first electrodes and the second electrodes.

8 Claims, 10 Drawing Sheets

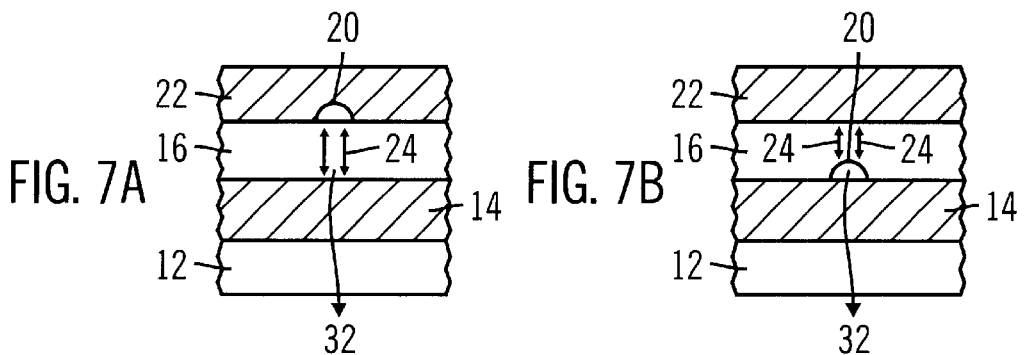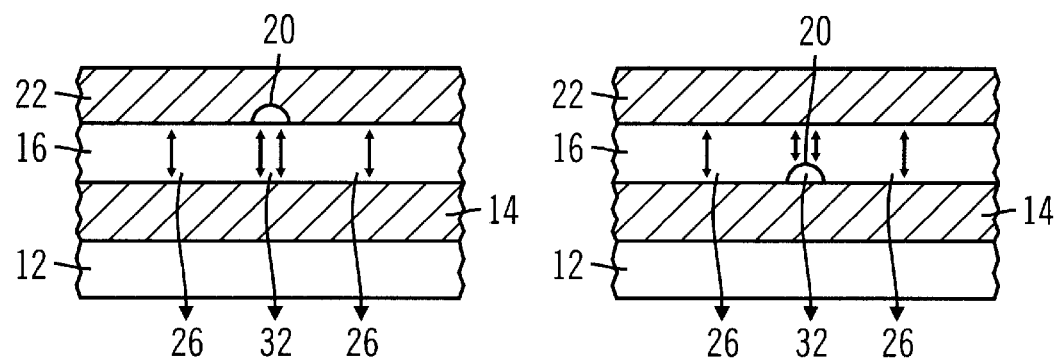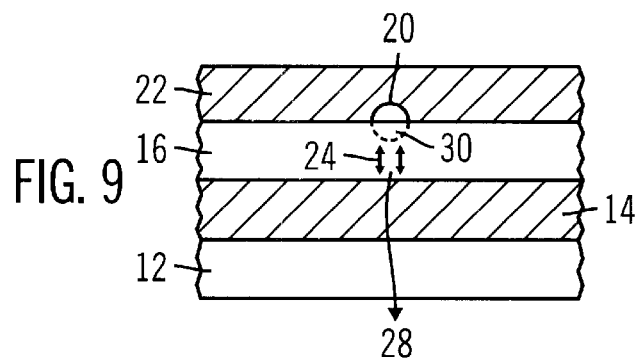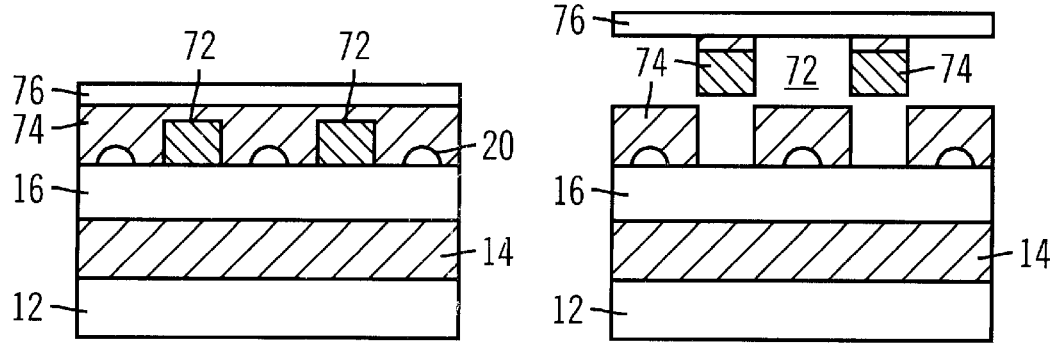

Electronic Transport & Luminescent Molecules
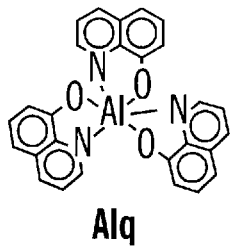
Alq
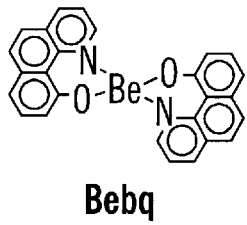
Bebq
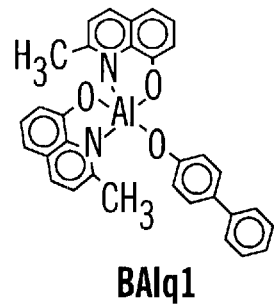
BAlq1
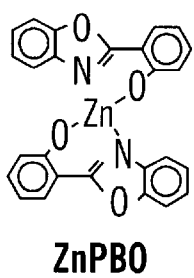
ZnPBO
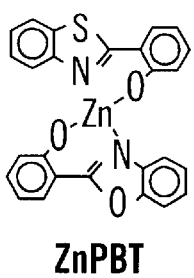
ZnPBT
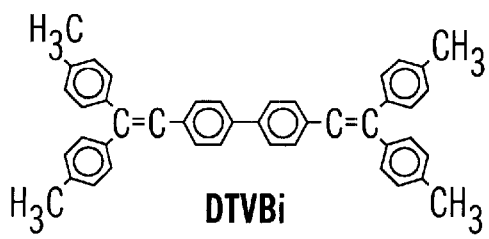
DTVBi
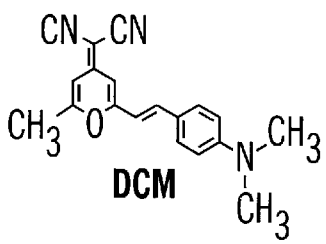
DCM
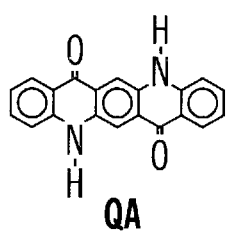
QA
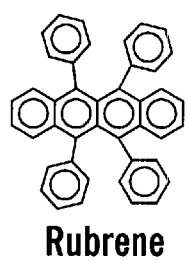
Rubrene
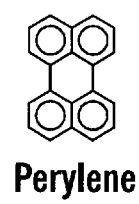
Perylene
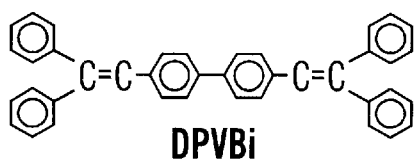
DPVBi
FIG. 18C

PROCESS FOR FABRICATING ORGANIC SEMICONDUCTOR DEVICES USING INK-JET PRINTING TECHNOLOGY AND DEVICE AND SYSTEM EMPLOYING SAME

BACKGROUND OF THE INVENTION

1. Field of the Invention

The present invention relates, generally, to organic semiconductor devices, and, in particular embodiments, to processes for fabricating organic semiconductor devices using ink-jet printing technology and devices and systems employing the same.

2. Description of Related Art

Inorganic semiconductors, such as silicon, are often used to produce modern semiconducting and photonic devices. The processing of these inorganic semiconductor devices can be complicated and costly, and typically includes process steps such as the growing of crystals, the slicing and polishing of wafers, and building of integrated electronic circuits on the wafer. By comparison, conventional polymers (sometimes referred to as plastics) are relative easy to process. For example, the fabrication of traditional plastic parts may include relatively simple process steps such as the injection of molten plastic material into molds. Conventional polymers are also flexible, lightweight, and can be fabricated over large surface areas. However, conventional plastics are not semiconducting, and are therefore unsuitable for the fabrication of semiconductor devices.

Conjugated polymer is an organic material that combines the electrical and optical properties of semiconductors and the processability of conventional plastics. The semiconducting properties of conjugated polymers originate from the delocalized pi orbitals formed in carbon containing compounds, such as poly(phenylenevinylene), polythiophene (PT), and poly(2-methoxy-5-(2'-ethylhexyloxy)-1,4-phenylene vinylene) (MEH-PPV). Unlike conventional polymers, conjugated polymers contain double bonds which make the material semiconducting rather than insulating. Conjugated polymers retain the low-cost processing benefits, flexibility, light weight, and large-scale producibility of conventional polymers and the general semiconducting characteristics of silicon.

Conjugated polymer devices are typically fabricated by spin-coating. Spin-coating takes advantage of the solution processability of polymer by spinning a substrate containing a large drop of liquid conjugated polymer at high velocity about an axis, causing the liquid conjugated polymer to flow outward and coat the substrate with a thin film of material. However, there are disadvantages associated with spin-coating. Spin-coating results in solution wastage, as the majority of the liquid conjugated polymer flies off the substrate instead of coating the surface. In addition, spin-coating is sensitive to dust or other imperfections on the surface of the substrate, for any projection will cause a shadow effect as the liquid organic material spreads across the surface of the substrate, leaving a radial trace of relatively thin organic material behind the imperfection.

The relatively uncontrolled flow of liquid conjugated polymer during spin-coating also does not allow for the formation of desired patterns, which limits the commercial applicability of conjugated polymers. For example, luminescent conjugated polymer sandwiched between two electrodes may be used for fabricating LEDs and light-emitting logos (LELs), but the single unpatterned layer of conjugated polymer produced by spin-coating limits such devices to a single color and requires that any patterning occur in the electrodes. Furthermore, photolithography techniques normally useful for creating patterned electrodes may not be used to pattern the layer of conjugated polymer, because the double bonds in the conjugated organic material will be destroyed by the photolithographic process.

Another class of organic semiconducting materials is the class of conjugated small organic molecules. Conjugated organic compounds (organics) are defined herein to include polymers (organics with more than two repeating units per molecular chain) and small organic molecules (organics comprised of single molecules). Small organic molecules share similar physical (electronic and optical) properties with conjugated polymers, but utilize somewhat different processing techniques. Organic molecules are usually processed using thermal sublimation at ultra high vacuum environments to form desired thin films, with typical thickness of about 100 nm. Organic molecules often use device structures similar to those used with conjugated polymers, i.e. organic thin films sandwiched between two electrodes. The patterning of the organic thin films can be achieved using a shadow mask, but this method requires the precise alignment of the shadow mask, and it is a slow and costly process. Furthermore, lateral resolution is also limited. Organic molecules can also be processed using the conventional spin-coating process, but this method lacks patterning capability. Organic molecules are typically processed by blending the molecules with a host conjugated polymer, such that the blend retains the advantageous mechanical properties of polymer for film forming purposes. Examples of typical organic compounds suitable for the buffer layers and for the ink-jet printing deposits are given in FIGS. 18a, 18b, and 18c.

Ink-jet printing (IJP) technology, a popular technology for desktop publishing, may be used for depositing patterned conjugated organic material with high resolution. The application of IJP to deposit patterned conjugated organics has been demonstrated in an article entitled "Ink-jet printing of doped polymers for organic light emitting devices" by T. R. Hebner et al., Applied Physics Letters, Vol. 72, p. 519 (1998), incorporated herein by reference. However, a low concentration of dye-containing polymer solution was printed in order to use existing IJP technology. The result was a poor film unsuitable for high quality semiconductor devices.

Even where suitable patterns of conjugated organics can be deposited over a lower electrode, other problems exist. Because of the dot-forming nature of IJP, organic film printed using IJP may contain pin holes. The deposition of the upper electrode material over the patterned conjugated organic thin film may result in some of the upper electrode material coming into contact with the lower electrode through the pin holes, creating short that renders the device unusable.

SUMMARY OF THE DISCLOSURE

Therefore, it is an object of embodiments of the present invention to provide a process for fabricating organic semiconductor devices using hybrid ink-jet printing technology, and systems and devices incorporating the same, that is relatively insensitive to substrate surface imperfections, and combines the electrical and optical properties of conventional semiconductors and the low-cost processability, flexibility, light weight, and large-scale producibility of conventional organics.

It is a further object of embodiments of the present invention to provide a process for fabricating organic semiconductor devices using hybrid ink-jet printing technology, and systems and devices incorporating the same, that allows the formation of precisely patterned single or multi-color emissive displays, devices, logos, and gray-scale pictures, including isolated emissive areas.

It is a further object of embodiments of the present invention to provide a process for fabricating organic semiconductor devices using hybrid ink-jet printing technology, and systems and devices incorporating the same, that allows the formation of high quality shadow masks for the fabrication of semiconductor devices, bio-sensors, photovoltaic devices, and photodetectors.

These and other objects are accomplished according to an emissive system for presenting visual images. The emissive system typically contains first electrodes deposited over and in contact with a substrate. One or more conjugated organic buffer layers are then deposited over and in contact with the first electrodes, and second electrodes are subsequently deposited over the conjugated organic buffer layers. The conjugated organic buffer layers regulate current flow between the first electrodes and the second electrodes. Either before or after the deposition of each conjugated organic buffer layer, but before the deposition of the second electrodes, conjugated organic deposits are ink-jet printed such that they are in contact with at least one conjugated organic buffer layer.

The conjugated organic deposits help to generate an indicator when a voltage stimulus is applied across the first electrodes and the second electrodes. Depending on the material of the conjugated organic deposits, the indicator may be luminescence, fluorescence, conductivity, or the like. A voltage source is used for selectively applying the voltage stimulus across the first electrodes and the second electrodes.

These and other objects, features, and advantages of embodiments of the invention will be apparent to those skilled in the art from the following detailed description of embodiments of the invention, when read with the drawings and appended claims.

BRIEF DESCRIPTION OF THE DRAWINGS

FIG. 7a is an illustration of a conjugated organic semiconductor device comprising a single second electrode and a single first electrode sandwiching a single conducting/charge transfer conjugated organic deposit printed on a single conjugated organic buffer layer according to an embodiment of the present invention.

FIG. 7b is an illustration of a conjugated organic semiconductor device comprising a single second electrode and a single first electrode sandwiching a single conjugated organic buffer layer deposited over a single conducting/charge transfer conjugated organic deposit according to an embodiment of the present invention.

FIG. 8a is an illustration of a conjugated organic semiconductor device comprising a single second electrode and a single first electrode sandwiching a single luminescent conjugated organic deposit printed on a single luminescent conjugated organic buffer layer according to an embodiment of the present invention.

FIG. 8b is an illustration of a conjugated organic semiconductor device comprising a single second electrode and a single first electrode sandwiching a single luminescent conjugated organic buffer layer deposited over a single luminescent conjugated organic deposit according to an embodiment of the present invention.

FIG. 9 is an illustration of a conjugated organic semiconductor device comprising a single second electrode and a single first electrode sandwiching a single luminescent and diffusing conjugated organic deposit printed on a single luminescent conjugated organic buffer layer according to an embodiment of the present invention.

FIG. 10a is an illustration of the depositing of organic masks, second electrode material, and adhesive sheeting in order to form multiple second electrodes on a conjugated organic semiconductor device according to an embodiment of the present invention.

FIG. 10b is an illustration of the removal of adhesive sheeting and organic masks in order to form multiple second electrodes on a conjugated organic semiconductor device according to an embodiment of the present invention.

FIG. 14b is a side view of the fabrication of the LEL illustrated in FIG. 14a.

FIG. 16b is a graph of a brightness curve indicating a typical relationship between brightness and the density of emissive dots for the gray scale of FIG. 16a.

FIGS. 18a, 18b, and 18c illustrate examples of typical organic compounds suitable for the buffer layers and for the ink-jet printing deposits.

DETAILED DESCRIPTION OF PREFERRED EMBODIMENTS

In the following description of preferred embodiments, reference is made to the accompanying drawings which form a part hereof, and in which is shown by way of illustration specific embodiments in which the invention may be practiced. It is to be understood that other embodiments may be utilized and structural changes may be made without departing from the scope of the preferred embodiments of the present invention.

Figure 1:
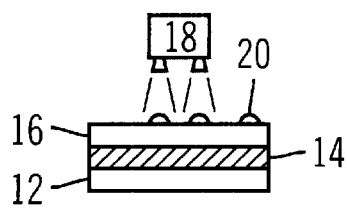
FIG. 1 is an illustration of the IJP of conjugated organic deposits over a conjugated organic buffer layer according to an embodiment of the present invention.

Conjugated organics retain the low-cost processing benefits, flexibility, light weight, and large-scale producibility of conventional organics and the general semiconducting characteristics of inorganic semiconductors. FIG. 1 illustrates a conjugated organic semiconductor device 10 according to an embodiment of the present invention. In conjugated organic semiconductor device 10, a first electrode 14, either metal or metal oxide, is formed over a substrate 12 using conventional deposition techniques. Substrate 12 may be comprised of solid materials such as glass, plastic, semiconductor wafers, and metal plates with a thin insulating layer above it, or flexible materials such as plastic and metal foils with a thin insulating layer above it. In preferred embodiments, first electrode 14 is comprised of indium tin-oxide (ITO). A substantially uniform conjugated organic buffer layer 16 with a thickness of about 1–1000 nm is then formed over first electrode 14 using spin-coating, thermal sublimation, or other conventional methods of application. An IJP head 18 is then used to print at least one conjugated organic deposit 20 over conjugated organic buffer layer 16. IJP is used because, unlike spin-coating, IJP is capable of printing conjugated organic deposits 20 with micrometer resolution, is relatively insensitive to dust and substrate defects because the conjugated organic deposits 20 are sprayed perpendicular to the surface of conjugated organic buffer layer 16 rather than flowed horizontally, and does not waste much material during the application process.

Figure 2A:
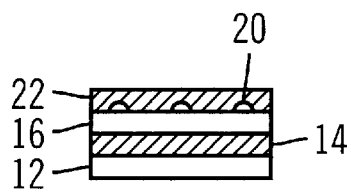
FIG. 2a is an illustration of a conjugated organic semiconductor device comprising a single second electrode and a single first electrode sandwiching a single layer of conjugated organic deposits printed on a single conjugated organic buffer layer according to an embodiment of the present invention.
Figure 2B:
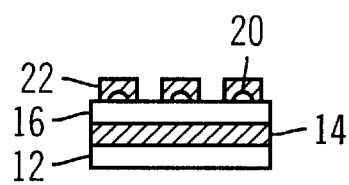
FIG. 2b is an illustration of a conjugated organic semiconductor device comprising multiple second electrodes and a multiple first electrodes (not visible from the illustrated view) sandwiching a single layer of conjugated organic deposits printed on a single conjugated organic buffer layer according to an embodiment of the present invention.

As illustrated in FIG. 2a, second electrode 22 is then deposited over conjugated organic deposits 20 and conjugated organic buffer layer 16 using conventional metal deposition techniques. Because conjugated organic buffer layer 16 is sufficiently insulating, no short can occur between second electrode 22 and first electrode 14.

Figure 3A:
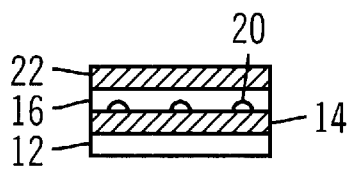
FIG. 3a is an illustration of a conjugated organic semiconductor device comprising a single second electrode and a single first electrode sandwiching a single conjugated organic buffer layer deposited over a single layer of conjugated organic deposits according to an embodiment of the present invention.
Figure 3B:
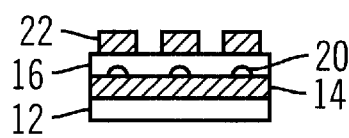
FIG. 3b is an illustration of a conjugated organic semiconductor device comprising multiple second electrodes and a multiple first electrodes (not visible from the illustrated view) sandwiching a single conjugated organic buffer layer deposited over a single layer of conjugated organic deposits according to an embodiment of the present invention.

In alternative embodiments of the present invention illustrated in FIG. 3a, conjugated organic deposits 20 are deposited using IJP directly over first electrode 14. Conjugated organic buffer layer 16 is then formed over conjugated organic deposits 20 and first electrode 14 using spin-coating or other conventional methods of application. Second electrode 22 is then deposited over conjugated organic buffer layer 16 using conventional metal deposition techniques.

Figure 4A:
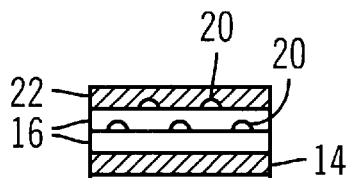
FIG. 4a is an illustration of a conjugated organic semiconductor device comprising a single second electrode and a single first electrode sandwiching multiple layers of conjugated organic deposits printed on multiple conjugated organic buffer layers according to an embodiment of the present invention.
Figure 4B:
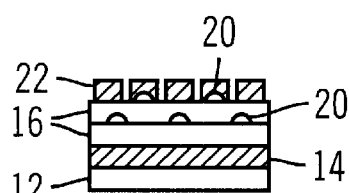
FIG. 4b is an illustration of a conjugated organic semiconductor device comprising multiple second electrodes and a multiple first electrodes (not visible from the illustrated view) sandwiching multiple layers of conjugated organic deposits printed on multiple conjugated organic buffer layers according to an embodiment of the present invention.
Figure 5A:
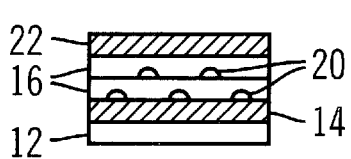
FIG. 5a is an illustration of a conjugated organic semiconductor device comprising single second electrode and a single first electrode sandwiching multiple conjugated organic buffer layers deposited over multiple layers of conjugated organic deposits according to an embodiment of the present invention.
Figure 5B:
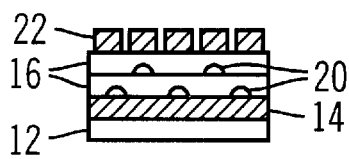
FIG. 5b is an illustration of a conjugated organic semiconductor device comprising multiple second electrodes and a multiple first electrodes (not visible from the illustrated view) sandwiching multiple conjugated organic buffer layers deposited over multiple layers of conjugated organic deposits according to an embodiment of the present invention.

In further alternative embodiments illustrated in FIGS. 4a and 5a, multiple conjugated organic buffer layers 16 and multiple layers of conjugated organic deposits 20 may be formed, adding a vertical or third dimension and increasing the functional density of the semiconductor device.

Although FIGS. 2a, 3a, 4a, and 5a illustrate embodiments with a single first electrode 14 and a single second electrode 22, in alternative embodiments of the invention illustrated in FIGS. 2b, 3b, 4b, 5b, and 6, multiple first (14) and second (22) electrodes may be deposited above individual conjugated organic deposits 20. It should be noted that although the illustrated views of FIGS. 2b, 3b, 4b, 5b, and 6 do not reveal multiple first electrodes 14, they are formed crosswise with respect to the multiple second electrodes 22 (shown in end views in FIGS. 2b, 3b, 4b, 5b, and 6).

Figure 6:
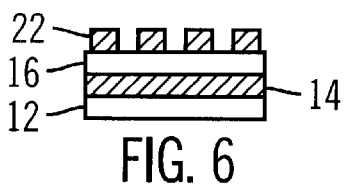
FIG. 6 is an illustration of a conjugated organic semiconductor device comprising multiple second electrodes and a multiple first electrodes (not visible from the illustrated view) sandwiching a single conjugated organic buffer layer according to an embodiment of the present invention.

In the embodiment of FIG. 6, multiple first electrodes 14 (not visible from the illustrated view) are ink-jet printed over substrate 12. A conjugated organic buffer layer 16 is then formed over multiple first electrodes 14 using spin-coating or other conventional methods of application. Multiple second electrode 22 are then ink-jet printed over conjugated organic buffer layer 16.

In alternative embodiments of the present invention illustrated in FIGS. 7a and 7b, where only one conjugated organic deposit 20 is shown for purposes of discussion, conjugated organic deposit 20 comprises conducting or charge transfer organic material. Because the conducting/charge transfer conjugated organic deposit 20 has better charge injection characteristics than the electrode material, when a voltage is applied across the second electrode 22 and first electrode 14, current 24 will flow between the second electrode 22 and first electrode 14 and through conjugated organic buffer layer 16 only where the conducting/charge transfer conjugated organic deposit 20 has been printed.

Among the various organic semiconductor devices, electroluminescent (EL) devices are especially attractive because of their potential applications in future lighting sources, single or multi-color displays, LELs, multi-color emissive devices, greeting cards, and low and high density information displays. Thus, in further alternative embodiments, first electrode 14 and substrate 12 are transparent, and conjugated organic buffer layer 16 comprises luminescent material. In such embodiments, current flow 24 though conjugated organic buffer layer 16 will result in luminescence 32 from the conjugated organic semiconductor device 10.

In alternative embodiments of the present invention illustrated in FIGS. 8a and 8b, where only one conjugated organic deposit 20 is shown for purposes of discussion, conjugated organic deposit 20 and conjugated organic buffer layer 16 are comprised of luminescent organic material, and first electrode 14 and substrate 12 are transparent. When a sufficiently high voltage is applied across the second electrode 22 and first electrode 14, current 24 will flow between the second electrode 22 and first electrode 14 and through conjugated organic buffer layer 16. In areas without a conjugated organic deposit 20, the conjugated organic buffer layer 16 will luminesce a color according to the composition of conjugated organic buffer layer 16 (see reference character 26). In areas with a conjugated organic deposit 20, the color of the luminescence will depend on where electrons and holes recombine. Generally, if the conjugated organic deposit 20 is thick enough, electrons and holes will recombine within the conjugated organic deposit 20 and the color of the luminescence (see reference character 32) will be in accordance with the composition of the conjugated organic deposit 20. If the conjugated organic deposit 20 is sufficiently thin, electrons and holes will recombine within the conjugated organic buffer layer 16 and the color of the luminescence will be in accordance with the composition of the conjugated organic buffer layer 16. If, however, the conjugated organic deposit 20 is about the same thickness as conjugated organic buffer layer 16, electrons will recombine near the boundary between the conjugated organic deposit 20 and conjugated organic buffer layer 16 and the luminescence may include colors in accordance with the composition of both the conjugated organic deposit 20 and conjugated organic buffer layer 16.

In alternative embodiments of the present invention illustrated in FIG. 9, where only one conjugated organic deposit 20 is shown for purposes of discussion, conjugated organic deposit 20 is comprised of conjugated organic material capable of partially diffusing into conjugated organic buffer layer 16. Conjugated organic buffer layer 16 is comprised of poly-9-vinylcarbazole (PVK) or polyfluorene (PF) or other similar compounds, and the conjugated organic deposit 20 is comprised of soluble poly(p-phenylenevinylene) (PPV), MEH-PPV, organic dyes, PF derivatives, or other similar compounds. In such embodiments, a small amount of the conductive conjugated organic deposit 20 will diffuse into the conjugated organic buffer layer 16 (see reference character 30) and act like a charge transfer dopant in the conjugated organic buffer layer 16. The diffusion of the guest dopant (conjugated organic deposit 20) into the host buffer layer (conjugated organic buffer layer 16) is a function of the material characteristics of the host and guest materials and the solvent compatibility (polar or non-polar) of the host and guest materials. Only a small amount of dopant is required to facilitate the energy transfer from the host to the guest and create current flow 24 between the second electrode 22 and first electrode 14 in the region of the conductive conjugated organic deposit 20 when a voltage is applied across the second electrode 22 and first electrode 14.

In further alternative embodiments, conjugated organic buffer layer 16 and the conjugated organic deposit material capable of partially diffusing into conjugated organic buffer layer 16 are luminescent, and first electrode 14 and substrate 12 are transparent. When current flow 24 is induced through conjugated organic buffer layer 16, areas where conjugated organic deposit 20 has partially diffused into conjugated organic buffer layer 16 (see reference character 30) will luminesce a color dependent on the bandgap and energy level of the material comprising the conjugated organic deposit 20 and conjugated organic buffer layer 16. Generally, if the conjugated organic deposit material has a bandgap smaller than the bandgap of the conjugated organic buffer layer and an energy level lower than that of the conjugated organic buffer layer, the color of the luminescence (see reference character 28) will be in accordance with the composition of the conjugated organic deposit 20. Otherwise, the color of the luminescence will be in accordance with the composition of the conjugated organic buffer layer 16.

IJP can also be utilized in the formation of multiple first and second electrodes (14 and 22) above individual conjugated organic deposits 20 as illustrated in FIGS. 2b, 3b, 4b, 5b, and 6. As illustrated in FIG. 10a, to form the multiple second electrodes 22 of FIG. 2b, organic masks 72 are first deposited using IJP over conjugated organic buffer layer 16. Next, second electrode material 74 is deposited over the organic masks 72 and conjugated organic buffer layer 16 by spin-coating or other conventional methods of application. Second electrode material 74 and the material comprising the organic masks 72 are selected such that second electrode material 74 strongly adheres to conjugated organic buffer layer 16, while the material comprising the organic masks 72 does not strongly adhere to conjugated organic buffer layer 16. Adhesive sheeting 76 such as adhesive tape is then pressed firmly over the second electrode material 74. When the adhesive sheeting 76 is removed, as illustrated in FIG. 10b, the dissimilar adhesive properties of second electrode material 74 and organic masks 72 cause the organic masks 72 and a portion of the second electrode material 74 to be removed along with the adhesive sheeting 76. The remaining second electrode material 74 comprises multiple second electrodes 22. This method of forming multiple second electrodes 22 is also applicable to the multiple first and second electrodes 14 and 22 of FIGS. 3b, 4b, 5b, and 6.

Figure 11A:
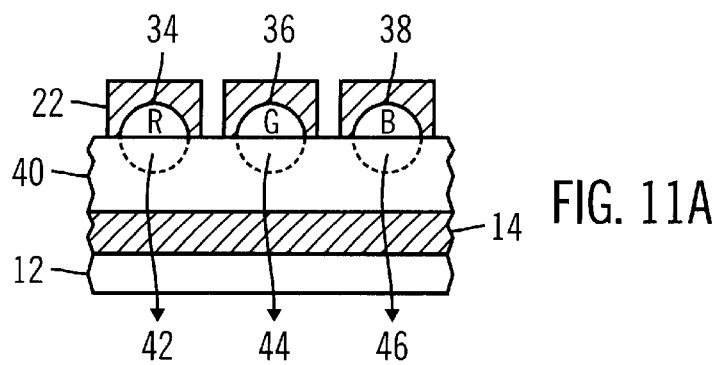
FIG. 11a is an illustration of red, green, and blue conjugated organic LEDs in a passive matrix multi-color emissive display according to an embodiment of the present invention.

Embodiments of the present invention provide a method for generating regular arrays of micron-size organic LEDs, wherein the dimensions of the LEDs are limited only by the nozzle size of the IJP head. One application for regular arrays of conjugated organic LEDs is found in multi-color emissive displays such as television screens or computer monitors, where red, green, and blue dots are used to produce a color picture. As illustrated in FIG. 11a, several different luminescent and diffusing conjugated organic deposits 34, 36, and 38, each with a band gap and energy level corresponding to red, green, and blue, respectively, are deposited over a conjugated organic buffer layer 40 with a bandgap and energy level corresponding to blue. The luminescent and diffusing conjugated organic deposits 34, 36, and 38 partially diffuse into the buffer layer 40 and alter the EL spectra of the buffer layer 40 such that when a voltage is applied across the second and first electrodes 22 and 14, the buffer layer 40 beneath the luminescent and diffusing conjugated organic deposits 34, 36, and 38 will luminesce red 42, green 44, and blue 46. By selectively applying a voltage between individual second electrodes 22 and first electrode 14, individual red, green, and blue LEDs can be turned on or off, and a passive matrix multi-color emissive display is produced.

Figure 11B:
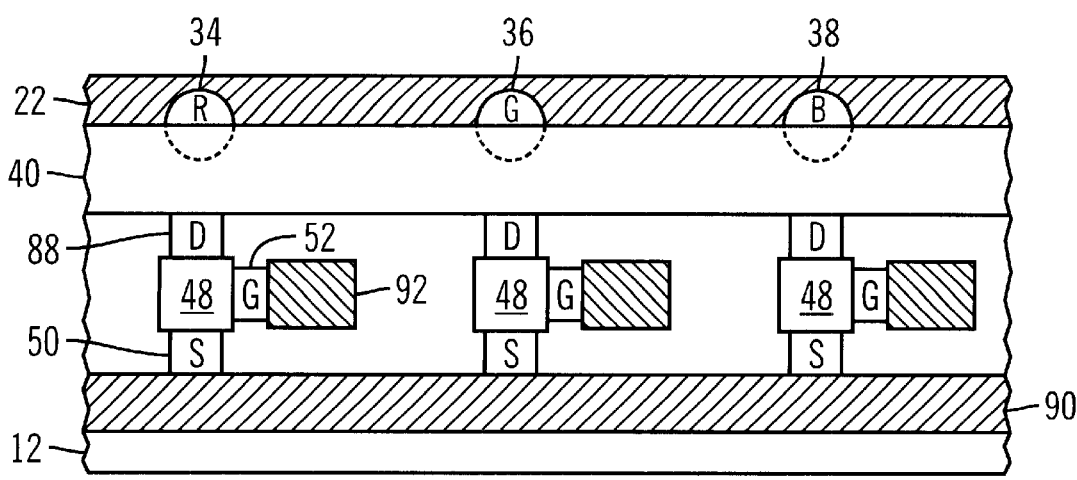
FIG. 11b is an illustration of red, green, and blue conjugated organic LEDs and controlling transistors in an active matrix multi-color emissive display according to an embodiment of the present invention.

In the alternative embodiment of FIG. 11b, an active matrix multi-color emissive display is illustrated. Multiple gate electrodes 92 are deposited over and in contact with substrate 12 using IJP or other conventional deposition techniques. Transistors 48 having insulating material 50, source electrodes 90, and drain electrodes 88 are fabricated over the multiple gate electrodes 92. A conjugated organic buffer layer 40 is then deposited over the transistor using spin-coating or other conventional application methods, the conjugated organic buffer layer 40 in contact with the drain electrodes 88. Luminescent and diffusing conjugated organic deposits 34, 36, and 38 are then ink-jet printed over the conjugated organic buffer layer 40. Finally, a single second electrode 22 is deposited over the luminescent and diffusing conjugated organic deposits 34, 36, and 38. Current through a source electrode 90, transistor 48, conjugated buffer layer 40, a conjugated organic deposit 34, 36, or 38, and second electrode 22, and the luminescence of the diffused conjugated organic buffer layer 40 is controlled by the voltage at gate terminal 52. It should be noted that FIG. 11b is only illustrative, and alternative embodiments of the invention may use other methods of fabricating the transistor-based active matrix multi-color emissive display.

Figure 12A:
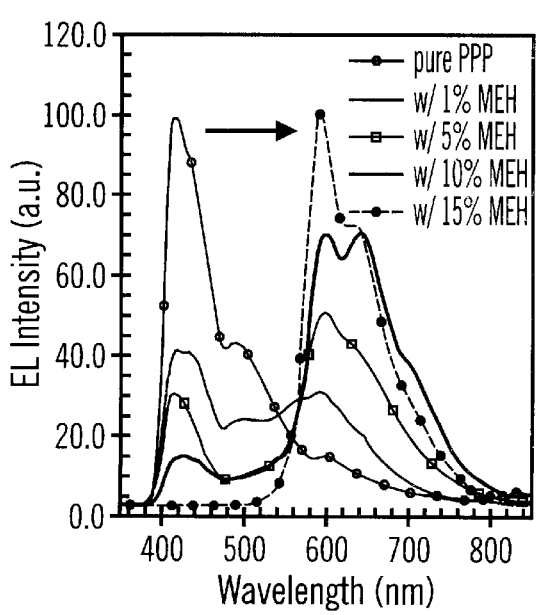
FIG. 12a is a graph illustrating how the emission color of a conjugated organic LED changes when different concentrations of luminescent conjugated organic dopant material are introduced into the luminescent conjugated organic buffer layer according to an embodiment of the present invention.
Figure 12B:
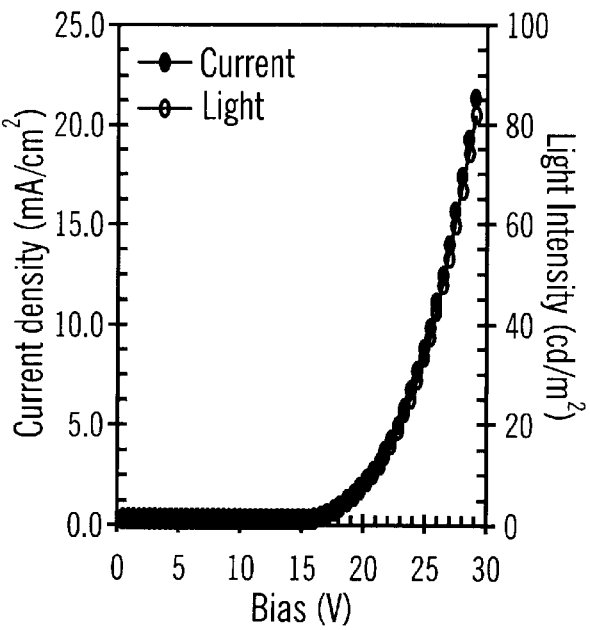
FIG. 12b is a graph illustrating that the I–V characteristics of a conjugated organic LED remain the same regardless of the concentration of luminescent conjugated organic dopant material introduced into the luminescent conjugated organic buffer layer according to an embodiment of the present invention.

Generally, when luminescent material with a higher bandgap and energy level (for example, the blue buffer layer 40 of FIG. 11a) is doped with luminescent material of the same or lower bandgap and energy level (for example, the red, green, and blue organic deposits 34, 36 and 38 of FIG. 11a), the resulting material produces the color of the lower bandgap and energy level material when a bias voltage is applied. In preferred embodiments, less than about 25% of the doping material needs to diffuse into the buffer layer 40 to achieve this color change. As an illustration, FIG. 12a shows how the emission colors of a poly(para-phenylene) (PPP) LED changes when different concentrations of MEH-PPV are introduced into the polymer system. FIG. 12b illustrates that the I–V characteristics remain the same regardless of the concentration of MEH-PPV.

Figure 13A:
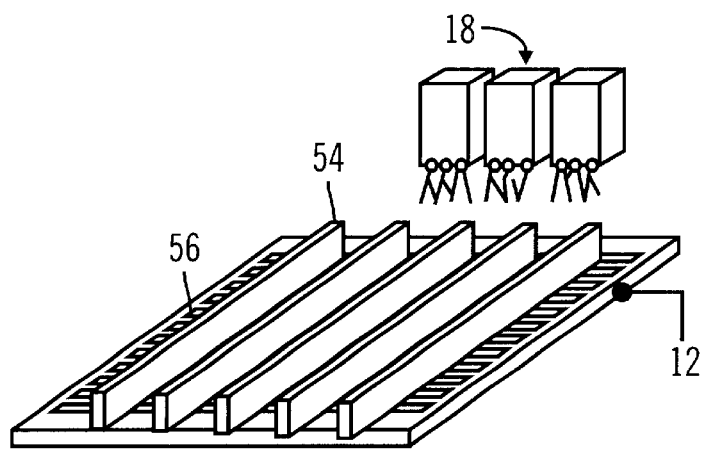
FIG. 13a is an illustration of the formation of arrays of conjugated organic LEDs for multi-color emissive displays using silicon-oxide dividers according to an embodiment of the present invention.
Figure 13B:
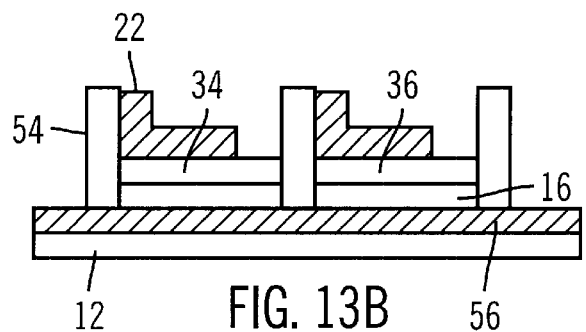
FIG. 13b is an side view of the formation of arrays of conjugated organic LEDs for multi-color emissive displays using silicon-oxide dividers according to an embodiment of the present invention.

In further alternative embodiments illustrated in FIG. 13a and 13b, arrays of red, green, and blue LEDs are fabricated by utilizing silicon-oxide ($SiO_2$) or polymer dividers 54 placed over a transparent substrate 12 printed with pre-patterned row electrodes 56. The $SiO_2$ dividers 54 allow the IJP of conjugated organic buffer layer 16 and red, green, and blue conducting/charge transfer polymers 34, 36, and 38 directly over row electrodes 56, and serve as a shadow mask for the deposition of second electrodes 22.

Another application for light-emitting conjugated organic semiconductor devices 10 is found in organic LELs and single or multi-color emissive devices, where the IJP is controlled to print a pattern of conducting/charge transfer conjugated organic material. In contrast to multi-color displays, where color patterns, as seen by the viewer, are constantly changing, LELs and single or multi-color emissive devices typically comprise larger, but fixed color, emissive areas. To form such devices, conducting/charge transfer and/or luminescent conjugated organic deposits 20 are printed directly onto conjugated organic buffer layer 16 (see FIG. 7a), or onto a transparent first electrode 14 (see FIG. 7b) in alternative embodiments. The pattern of conjugated organic deposits 20 defines the light-emission area. By applying a voltage between second electrodes 22 and first electrode 14, large LELs may be illuminated. Because current flows through the conjugated organic deposits 20 but is not carried away by it, the conjugated organic deposits 20 may have disconnections (physically isolated patterns). High contrast of LELs against a background can be achieved by adjusting the biasing voltage, and the brightness of the LEL can be adjusted over a broad range, from a few tenths of a candela (cd)/$m^2$ to more than 100 cd/$m^2$.

Figure 14A:
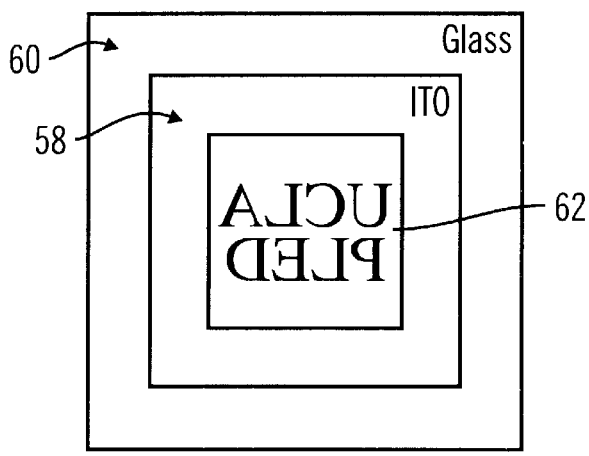
FIG. 14a illustrates the fabrication of a LEL according to an embodiment of the present invention.
Figure 14B:
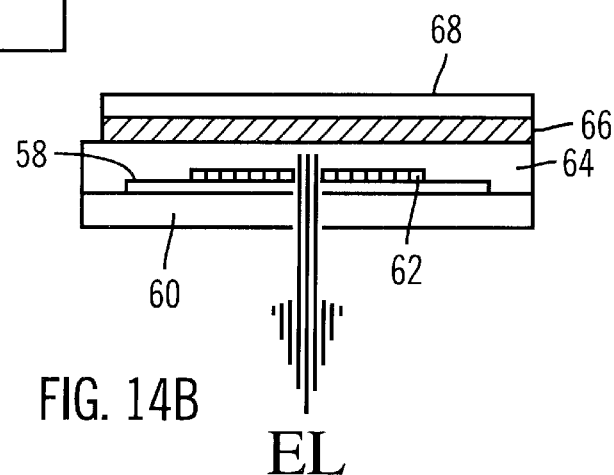

LEL fabrication according to a preferred embodiment of the present invention is illustrated in FIG. 14a. First, an ITO electrode 58 deposited on a glass substrate 60 is subjected to a routine ultrasonic cleaning with the successive use of detergent, deionized (DI) water, acetone, and alcohol to wash away surface contaminants. The ITO electrode 58 and glass substrate 60 are then baked at an elevated temperature for about 12 hours. IJP is then used to deposit conducting polymer logo 62 onto ITO electrode 58 from an aqueous solution of 3,4-polyethylenedioxythiophene-polystyrenesulfonate (PEDOT). The PEDOT conducting polymer logo 62 is then dried in air at about 100° C. for approximately 12 hours. In alternative embodiments, other methods of depositing the PEDOT conducting polymer logo 62 such as the stamping method described in "Microcontact printing and electroplating on curved substrates: production of free-standing three-dimensional metallic microstructures," by J. A. Rogers et al., Adv. Materials, Vol. 9, pp. 475–477 (1997), incorporated herein by reference, may be employed. As illustrated in FIG. 14b, an MEH-PPV buffer layer 64 prepared from an approximate 1% MEH-PPV solution is subsequently spin-coated over the PEDOT conducting polymer logo 62 at about 2500 revolutions per minute (RPM), and calcium (Ca) cathode material 66 is deposited over MEH-PPV buffer layer 64. The finished devices are encapsulated by epoxying the active cathode areas with aluminum or cover glass 68. It should be noted that other materials with characteristics similar to those specified above may also be used in the fabrication process.

Figure 15:
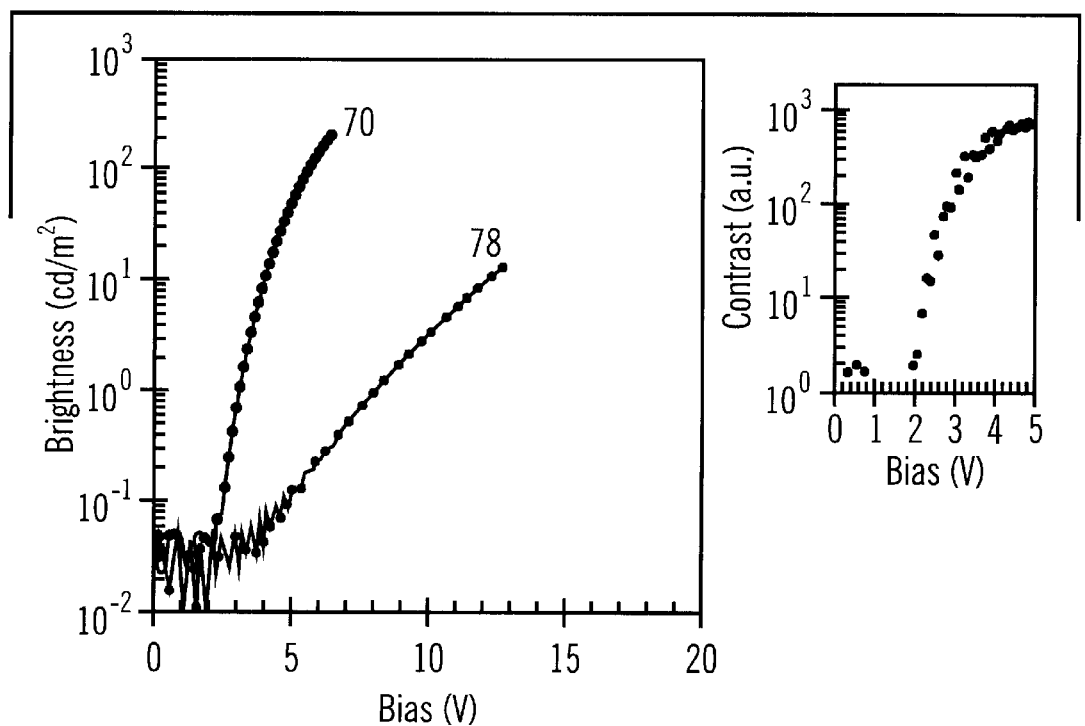
FIG. 15 is a graph of typical brightness-voltage (L–V) curves of devices with and without conjugated organic deposits, illustrating the enhanced performance obtained from the addition of conjugated organic deposits according to an embodiment of the present invention.

FIG. 15 shows typical brightness-voltage (L–V) curves of devices with (reference character 70) and without (reference character 78) a PEDOT conducting polymer layer, illustrating the enhanced performance obtained from the addition of the PEDOT conducting polymer layer. For example, when the device is operated at 5 volts, LEDs with the PEDOT conducting polymer layer may produce brightness levels of approximately 200 cd/$m^2$, while LEDs without the PEDOT conducting polymer layer may produce brightness levels approximately three orders of magnitude smaller.

Figure 16B:
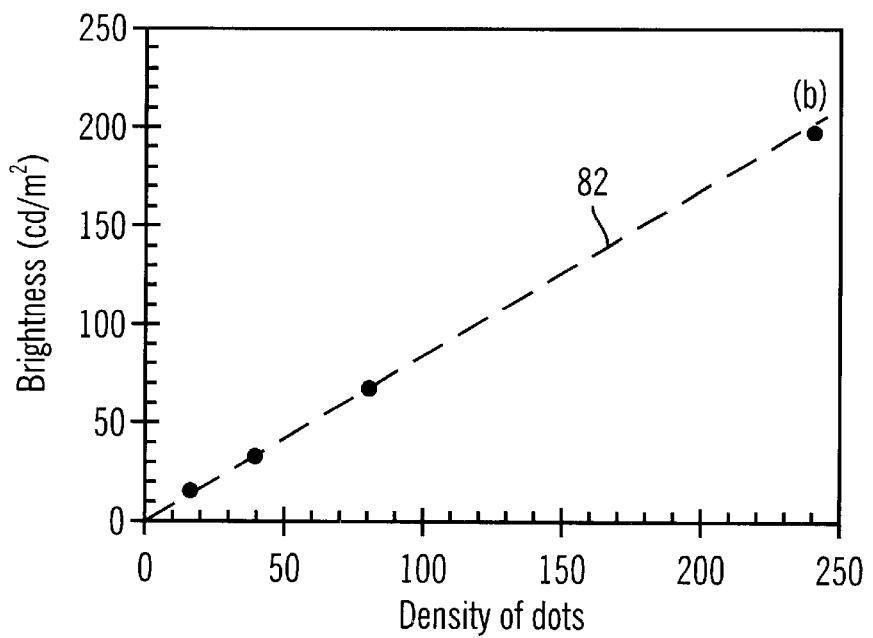
Figure 16A:
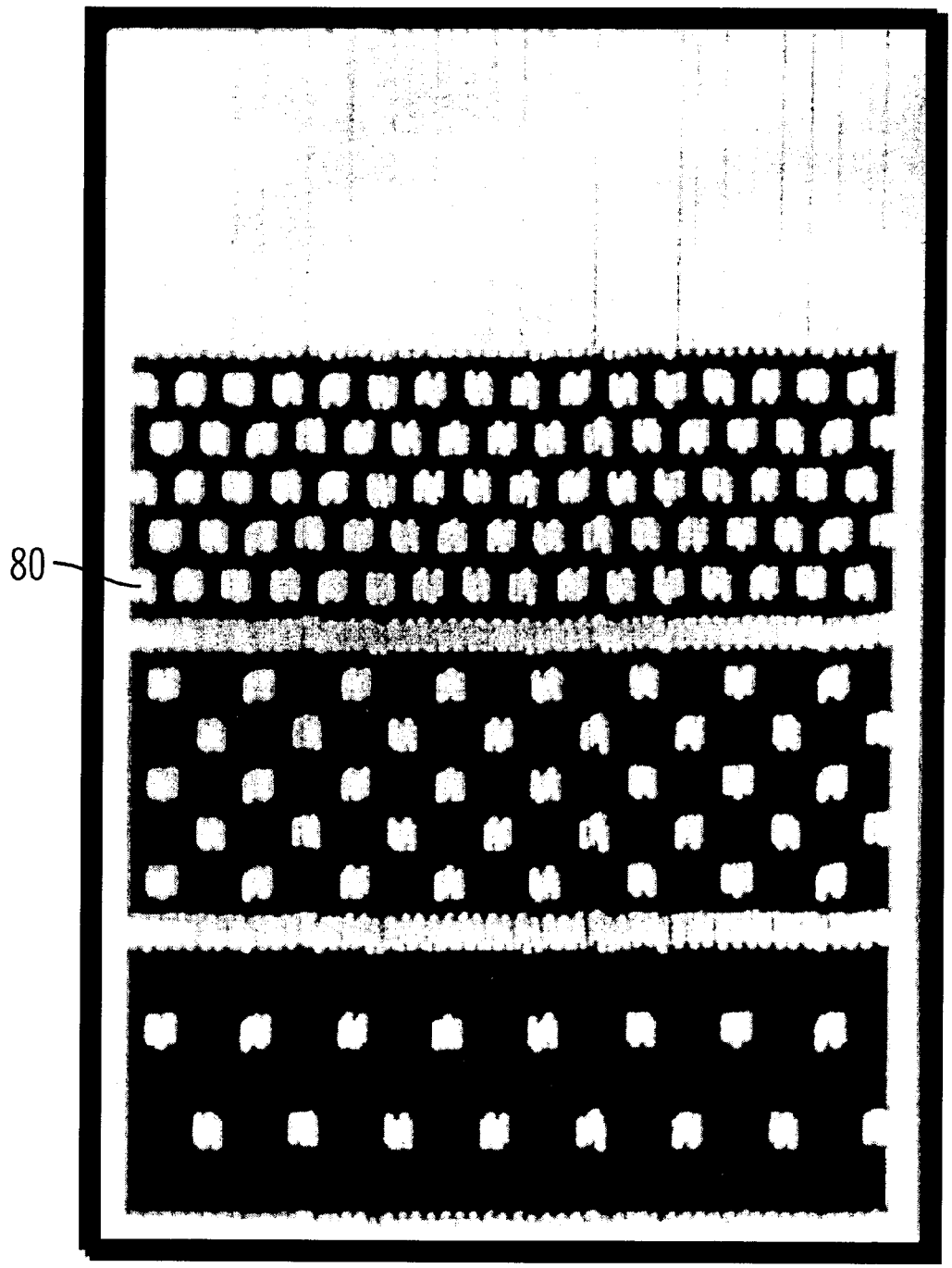
FIG. 16a illustrates a four-level gray scale defined by the density of emissive dots for use in generating light-emitting pictures according to an embodiment of the present invention.

In alternative embodiments of the present invention, a specific application of LELs may be used to produce gray-scale light-emitting pictures. FIG. 16a illustrates a four-level gray scale 80 defined by the density of emissive dots, and FIG. 16b shows a brightness curve 82 indicating a typical relationship between brightness and the density of emissive dots. Gray scales utilizing embodiments of the present invention can be tuned nearly continuously by changing either the dot size or the density of dots.

In addition to organic EL logos and displays, embodiments of the present invention can also be applied to other organic electronic and optoelectronic devices. Examples include, but are not limited to, transistors, photovoltaic cells, artificial noses, physical devices, chemical devices, bio-devices, and electronic integrated circuits. Physical devices include, but are not limited to, optical sensors (arrays), x-ray detectors (arrays), image sensors (arrays), photodetectors, and photovoltaic devices. Chemical devices include, but are not limited to, gas sensors (array) and wet (solvent) sensors. Bio-devices include, but are not limited to, sensors for detecting blood sugar (glucose), enzymes, and the like. In addition, IJP provides an efficient way of fabricating LEDs on semiconductor wafers as light sources to be used for inter-chip and intra-chip communication in computers, telecommunication devices, and the like. Materials usable in embodiments of the present invention to pattern the electronic devices include, but are not limited to, organic conjugated molecules, conjugated polymers, inorganic nano crystals, organic nano crystals, dye molecules, and any combination of the above. These devices may provide output in the form of luminescence, as previously described, or conductivity or fluorescence.

Figure 17A:
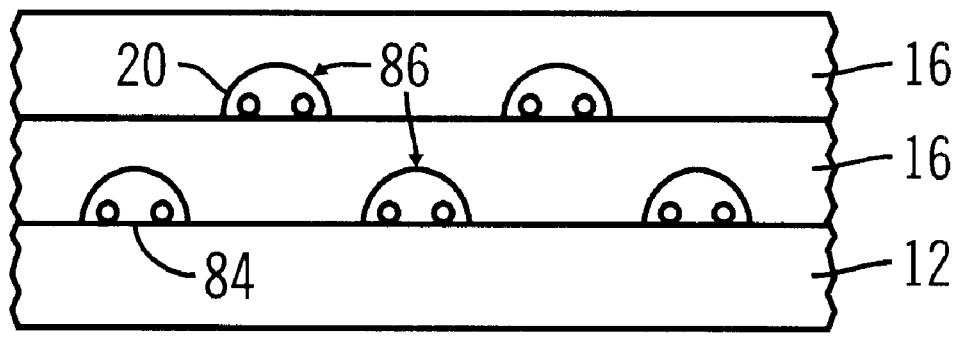
FIG. 17a illustrates an artificial nose with conductivity indicators according to an embodiment of the present invention.

An artificial nose provides an illustrative example of embodiments of the present invention that utilize conductivity or fluorescence as a form of indication. As illustrated in FIG. 17a, multiple layers of conjugated organic deposits 20 and conjugated organic buffer layer 16 are built up using the techniques previously described over a substrate 12. However, prior to the IJP of each conjugated organic deposit 20, two electrodes 84 are situated such that the conjugated organic deposits 20 form over the two electrodes 84. Each conjugated organic deposit 20 may be comprised of unique material such that the conductivity of each conjugated organic deposit 20 varies when a fluid or vapor sample 86 diffuses into the conjugated organic buffer layer 16 and into the conjugated organic deposits 20. The conductivity of each conjugated organic deposit 20 is sensed by the two electrodes 84 within that conjugated organic deposit 20. Multiple conjugated organic deposits 20 on each layer may provide a conductivity "signature" that can be used to identify the chemical composition of the fluid or vapor sample 86. In further alternative embodiments, the multiple conjugated organic buffer layers 16 may be comprised of unique material such that each conjugated organic buffer layer 16 acts as a fluid or vapor separation membrane. Thus, each layer of conjugated organic deposits 20 may be designed to test only a particular category of fluid or vapor, as other types of fluid or vapor will be filtered out by the multiple conjugated organic buffer layers 16.

Figure 17B:
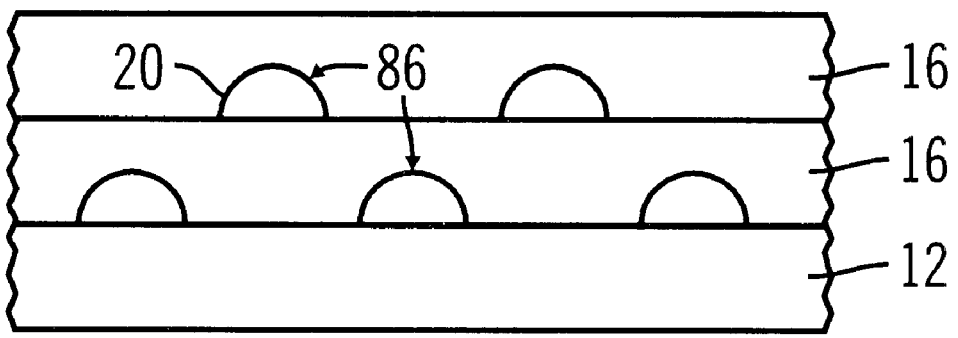
FIG. 17b illustrates an artificial nose with fluorescence indicators according to an embodiment of the present invention.
Figure 18A:
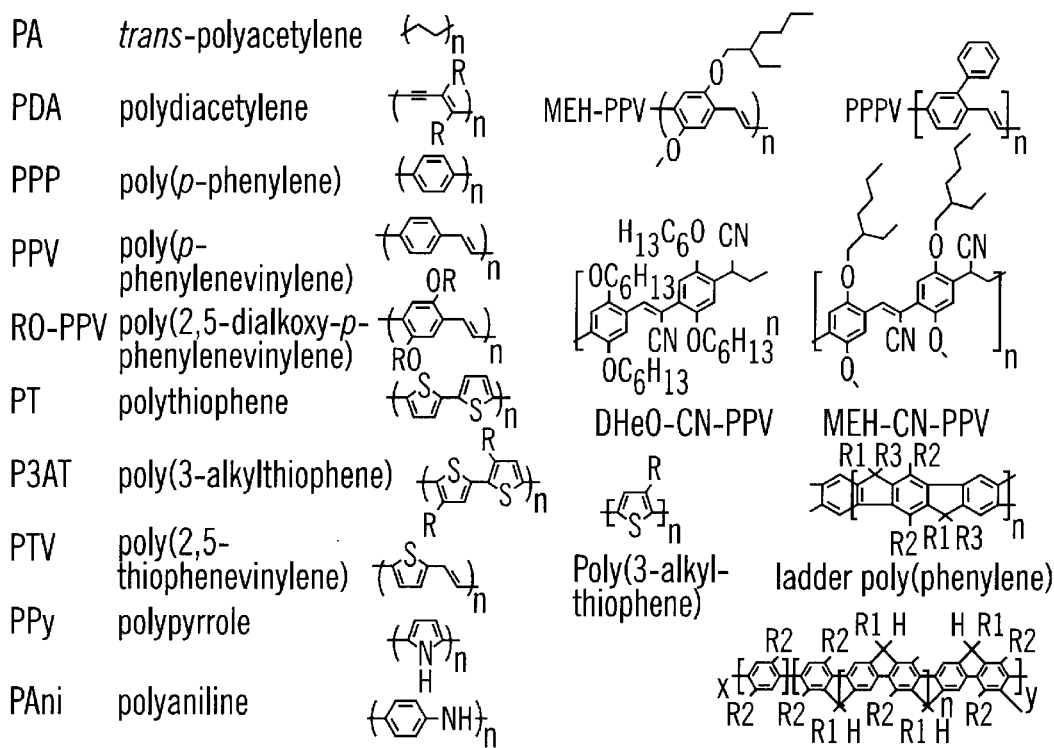
Figure 18B:
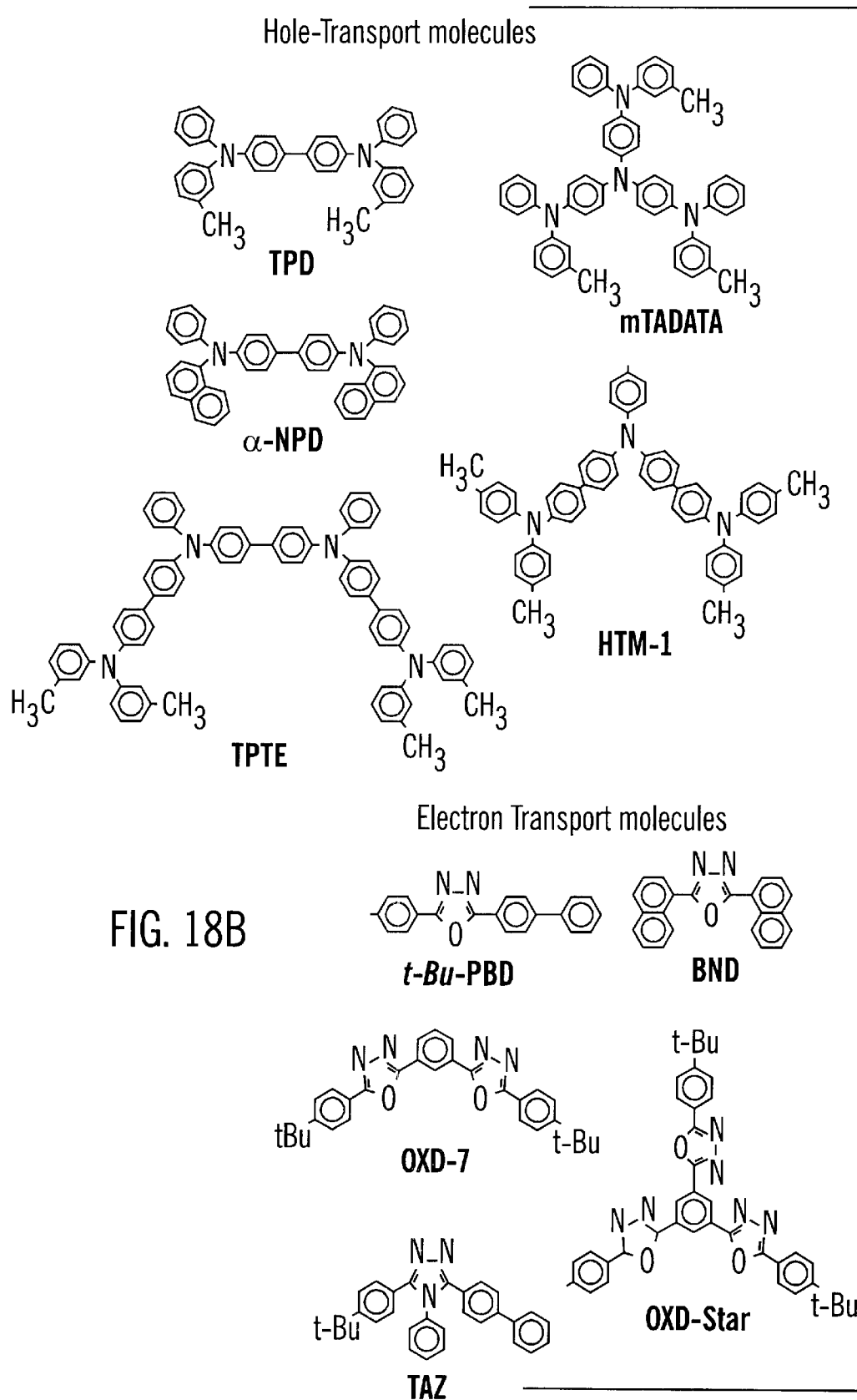

In alternative embodiments of the present invention illustrated in FIG. 17b, the multiple conjugated organic deposits 20 are fluorescent under certain conditions, and there are no electrodes within the conjugated organic deposits 20. Each conjugated organic deposit 20 may be comprised of unique material such that the fluorescence of each conjugated organic deposit 20 varies when a fluid or vapor sample 86 diffuses into the conjugated organic buffer layer 16 and into the conjugated organic deposits 20. The fluorescence of each conjugated organic deposit 20 may be sensed by shining an ultraviolet (UV) light over the device. Multiple conjugated organic deposits 20 on each layer may provide a fluorescence "signature" that can be used to identify the chemical composition of the fluid or vapor sample 86. In further alternative embodiments, the multiple conjugated organic buffer layers 16 may be comprised of unique material such that each conjugated organic buffer layer 16 acts as a fluid or vapor separation membrane. Thus, each layer of conjugated organic deposits 20 may be designed to test only a particular category of fluid or vapor, as other types of fluid or vapor will be filtered out by the multiple conjugated organic buffer layers 16.

Therefore, according to the foregoing description, embodiments of the present invention provide a process for fabricating organic semiconductor devices using ink-jet printing technology, and systems and devices incorporating the same, that is relatively insensitive to substrate surface imperfections, and combines the electrical and optical properties of conventional semiconductors and the low-cost processability, flexibility, light weight, and large-scale producibility of conventional organics. In addition, embodiments of the present invention allow the formation of precisely patterned single or multi-color emissive displays, devices, logos, and gray-scale pictures, including isolated emissive areas. Embodiments of the present invention also enable the formation of high quality shadow masks for the fabrication of semiconductor devices, bio-sensors, photovoltaic devices, and photodetectors.

The foregoing description of preferred embodiments of the invention has been presented for the purposes of illustration and description. It is not intended to be exhaustive or to limit the invention to the precise form disclosed. It is intended that the scope of the invention be limited not by this detailed description, but rather by the claims appended hereto.

What is claimed is:

1. A process for fabricating a semiconductor device capable of producing an indicator in response to a stimulus, the process comprising:

supporting at least one first electrode over a substrate;

supporting at least one conjugated organic buffer layer above the at least one first electrode such that one conjugated organic buffer layer is in contact with each first electrode;

ink-jet printing at least one conjugated organic deposit above the at least one first electrode such that each conjugated organic deposit is in contact with at least one conjugated organic buffer layer; and supporting at least one second electrode over an uppermost conjugated organic buffer layer.

2. A process as recited in claim 1, wherein the step of supporting at least one second electrode over an uppermost conjugated organic buffer layer comprises the steps of:

ink-jet printing at least one organic mask over and in contact with the uppermost conjugated organic buffer layer, the at least one organic mask having low adhesion strength when in contact with the uppermost conjugated organic buffer layer;

supporting second electrode material over and in contact with the at least one organic mask and the uppermost conjugated organic buffer layer, the second electrode material having high adhesion strength when in contact with the uppermost conjugated organic buffer layer and the at least one organic mask;

applying adhesive sheeting to the second electrode material; and removing the adhesive sheeting, wherein the at least one organic mask and second electrode material above the at least one organic mask will also be removed.

3. A process as recited in claim 1, wherein the step of supporting at least one second electrode over an uppermost conjugated organic buffer layer comprises the steps of:

shadow masking areas on the uppermost conjugated organic buffer layer where no second electrode material is to be deposited using dividers; and ink-jet printing second electrode material between the dividers.

4. A process for fabricating semiconductor devices capable of producing an indicator in response to a stimulus, the process comprising:

supporting a plurality of source electrodes over a substrate;

supporting a plurality of gate electrodes over the substrate;

supporting a plurality of transistors between the plurality of source electrodes and the plurality of gate electrodes, each transistor having a source terminal coupled to a source electrode, a gate terminal coupled to a gate electrode, and a drain terminal;

supporting a second electrode over the plurality of transistors;

supporting a conjugated organic buffer layer between the plurality of transistors and the second electrode such that the conjugated organic buffer layer is in contact with the drain terminals of the plurality of transistors and the second electrode;

ink-jet printing a plurality of conjugated organic deposits above each transistor such that the plurality of conjugated organic deposits are in contact with the conjugated organic buffer layer and the second electrode.

5. A process for fabricating a semiconductor device capable of producing an indicator in response to a stimulus, the process comprising:

ink-jet printing at least one conjugated organic deposit over a substrate; and supporting a first conjugated organic buffer layer over each conjugated organic deposit such that each conjugated organic deposit is in contact with the first conjugated organic buffer layer.

6. A process as recited in claim 5, wherein preceding the step of ink-jet printing at least one conjugated organic deposit over a substrate, the process further includes the step of supporting at least one first electrode and second electrode pair over the substrate such that each conjugated organic deposit is ink-jet printed over a first electrode and second electrode pair.

7. A process as recited in claim 5, further including the steps of:

ink-jet printing at least one additional layer of at least one conjugated organic deposit over the first conjugated organic buffer layer; and supporting an additional conjugated organic buffer layer over each additional layer of at least one conjugated organic deposit such that each additional layer of at least one conjugated organic deposit is in contact with the additional conjugated organic buffer layer.

8. A process as recited in claim 7, wherein preceding the step of ink-jet printing at least one additional layer of at least one conjugated organic deposit over the first conjugated organic buffer layer, the process further includes the step of supporting at least one first electrode and second electrode pair over the first conjugated organic buffer layer such that each conjugated organic deposit is ink-jet printed over a first electrode and second electrode pair.

* * * * *